(12) United States Patent
Murata

(10) Patent No.: US 8,212,201 B2
(45) Date of Patent: Jul. 3, 2012

(54) PHOTOELECTRIC CONVERTER AND PHOTOELECTRIC CONVERSION ELEMENT

(75) Inventor: Masaki Murata, Tokyo (JP)

(73) Assignee: Sony Corporation, Tokyo (JP)

( * ) Notice: Subject to any disclaimer, the term of this patent is extended or adjusted under 35 U.S.C. 154(b) by 534 days.

(21) Appl. No.: 12/510,392

(22) Filed: Jul. 28, 2009

(65) Prior Publication Data

US 2010/0032548 A1    Feb. 11, 2010

(30) Foreign Application Priority Data

Aug. 5, 2008  (JP) ................................. 2008-202296

(51) Int. Cl.
*G01J 1/44* (2006.01)
(52) U.S. Cl. .................. 250/214.1; 250/214 R; 257/291
(58) Field of Classification Search ............... 250/214.1, 250/214 R, 208.1; 257/291
See application file for complete search history.

(56) References Cited

U.S. PATENT DOCUMENTS

| 7,196,312 B2 * | 3/2007 | Shizukuishi | ............... | 250/214.1 |
| 7,214,921 B2 * | 5/2007 | Miyashita et al. | ......... | 250/208.1 |

FOREIGN PATENT DOCUMENTS

| JP | 03-017178 | 1/1991 |
| JP | 07-094690 | 4/1995 |
| JP | 11-037838 | 2/1999 |
| JP | 2000-267223 | 9/2000 |
| JP | 2002-176191 | 6/2002 |
| JP | 2006-100797 | 4/2006 |
| JP | 2008-258421 | 10/2008 |
| WO | 2004/013915 | 2/2004 |

OTHER PUBLICATIONS

Piergiulio Di Marco et al.; Photogeneration and Transport of Charge in Vacuum Sublimed Linear Trans-Quinacridone Layers; Mol. Cryst. Liq. Cryst.; 1992; vol. 217, pp. 223-229.
Japanese Office Action issued on Jun. 14, 2011 in connection with corresponding Japanese Appl. No. 2008-202296.
Japanese Office Action issued on May 11, 2010 in connection with corresponding Japanese Appl. No. 2008-202296.

* cited by examiner

*Primary Examiner* — Seung C Sohn
(74) *Attorney, Agent, or Firm* — SNR Denton US LLP

(57) ABSTRACT

A photoelectric converter includes a photoelectric conversion element, which includes a first electrode and a second electrode disposed discretely and a photoelectric conversion material layer disposed between the first electrode and the second electrode and in which a current generated in the photoelectric conversion material layer changes with the lapse of an application time, where a constant amount of light is applied to the photoelectric conversion material layer while a voltage is applied between the first electrode and the second electrode, and a current detection circuit to detect the change in the current.

17 Claims, 8 Drawing Sheets

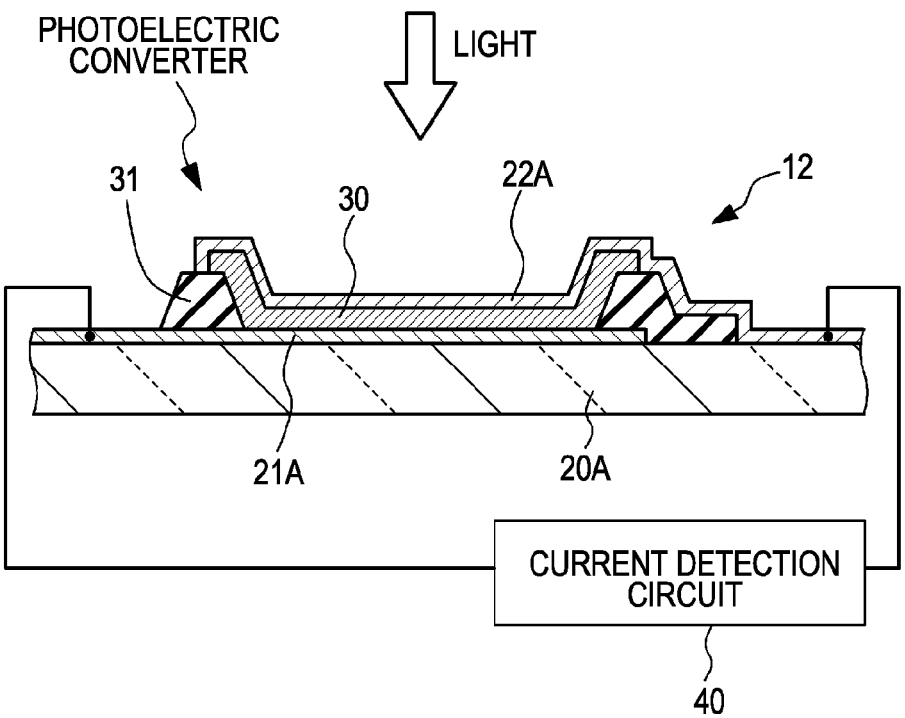
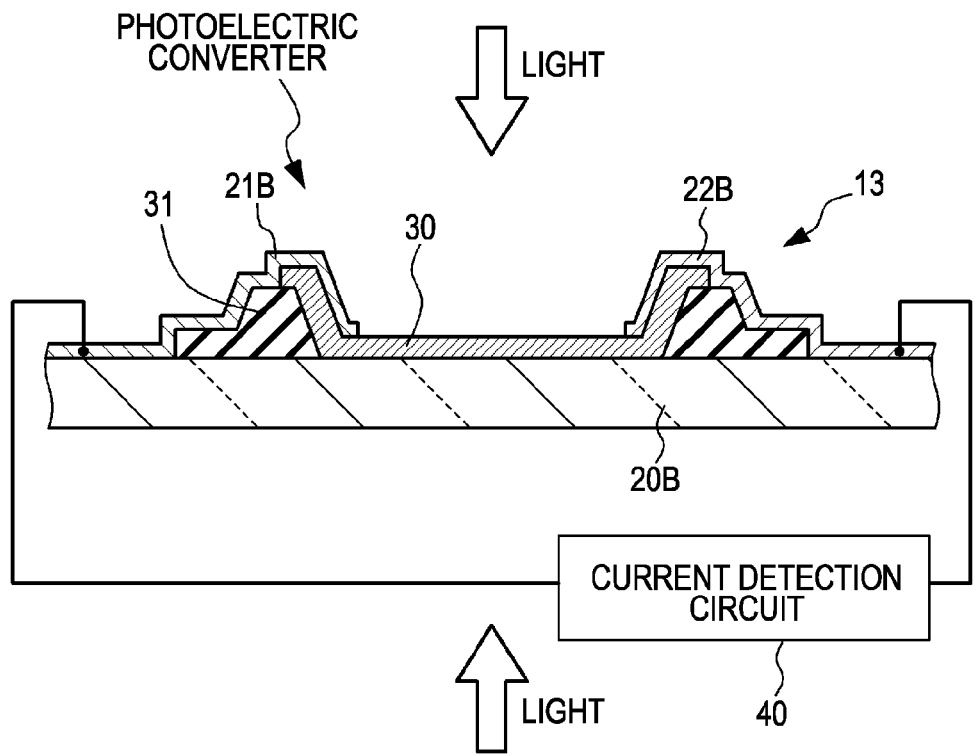

PHOTOELECTRIC CONVERTER AND PHOTOELECTRIC CONVERSION ELEMENT

BACKGROUND OF THE INVENTION

1. Field of the Invention

The present invention relates to a photoelectric conversion element and a photoelectric converter including the photoelectric conversion element.

2. Description of the Related Art

Photoelectric conversion elements, e.g., image sensors, usually have a structure in which a photoelectric conversion part is sandwiched between two electrodes. Then, an output (for example, current) from the photoelectric conversion element has no time dependence and is detected as a steady-state output (steady-state current). This is because a semiconductor material typified by silicon (Si) forms an electric double layer instantaneously and gives a steady-state current at commonly used electric field strength.

For example, Japanese Unexamined Patent Application Publication No. 2006-100797 discloses an imaging element, in which a photoelectric conversion part is formed from an organic semiconductor material. This imaging element includes an organic photoelectric conversion film sandwiched between at least two electrodes. This organic photoelectric conversion film contains a quinacridone derivative or a quinazoline derivative.

SUMMARY OF THE INVENTION

In this regard, in the technology disclosed in Japanese Unexamined Patent Application Publication No. 2006-100797, a common color reading circuit is used for reading a signal (refer to Paragraph [0135]). Therefore, it is believed that signals output from a photoelectric conversion element of the imaging element disclosed in the above-described patent document so as to be read are signals which do not have time dependence and which are steady-state parts of output signals. However, reading of such steady-state parts of output signals have problems in that the sensitivity is low and the S/N ratio is low.

Accordingly, it is desirable to provide a new photoelectric conversion element including a photoelectric conversion material layer having high sensitivity and high S/N ratio and a photoelectric converter including the photoelectric conversion element.

A photoelectric converter according to an embodiment of the present invention includes (a) a photoelectric conversion element, which includes (a-1) a first electrode and a second electrode disposed discretely and (a-2) a photoelectric conversion material layer disposed between the first electrode and the second electrode and in which a current generated in the photoelectric conversion material layer changes with the lapse of an application time, and (b) a current detection circuit to detect the change in the current, where a constant amount of light is applied to the photoelectric conversion material layer while a voltage is applied between the first electrode and the second electrode.

A photoelectric conversion element according to an embodiment of the present invention includes (A) a first electrode and a second electrode disposed discretely and (B) a photoelectric conversion material layer disposed between the first electrode and the second electrode, wherein a current generated in the photoelectric conversion material layer changes with the lapse of an application time, where a constant amount of light is applied to the photoelectric conversion material layer while a voltage is applied between the first electrode and the second electrode.

In the photoelectric converter or the photoelectric conversion element according to an embodiment of the present invention, the above-described change in the current in the photoelectric conversion material layer with the lapse of the application time may correspond to a change in a transient current passing a capacitor, where it is assumed that the first electrode, the photoelectric conversion material layer, and the second electrode constitute the capacitor.

Furthermore, in the above-described case, the time constant in a current decreasing period of the above-described change in the current may be assumed to be $\tau(P)$, and the $\tau(P)$ may be represented as a function of the amount of light applied to the photoelectric conversion material layer per unit time. In addition, in the photoelectric converter according to an embodiment of the present invention, the current detection circuit may be configured to calculate the $\tau(P)$.

Alternatively, in the above-described case, the time constant in a current decreasing period of the above-described change in the current may be assumed to be $\tau(P)$, the current $I_{dec}$ in the current decreasing period may be represented by $$I_{dec} = C_1 \cdot I_0(P) \cdot \exp\{-t/\tau(P)\} + C_2 \tag{1}$$

where t represents an elapsed time from a current decreasing period starting time, at which transition from a current increasing period to the current decreasing period occurs in the change in the current and at which t is assumed to be 0, $I_0(P)$ represents a current generated in the photoelectric conversion material layer, wherein a constant amount of light is applied to the photoelectric conversion material layer at t=0, and $C_1$ and $C_2$ represents independently a constant. In addition, in the photoelectric converter according to an embodiment of the present invention, the current detection circuit may be configured to determine $I_{dec}$. Furthermore, in this case, in the photoelectric converter according to an embodiment of the present invention, it is preferable that the current detection circuit determines the integral of the current by evaluating the integral from 0 to 100 milliseconds, at the maximum, of the above-described formula (1) with respect to t. Moreover, in the photoelectric conversion element according to an embodiment of the present invention, it is preferable that the integral of the current (including a physical value calculated on the basis of the integral of the current) determined by evaluating the integral from 0 to 100 milliseconds, at the maximum, of the above-described formula (1) with respect to t exhibits the dependence on the amount of light.

In the photoelectric converter or the photoelectric conversion element, which includes the above-described preferable forms and configurations, according to an embodiment of the present invention, it is preferable that the photoelectric conversion material layer is formed from an organic material. In this case, it is more preferable that the photoelectric conversion material layer has a carrier mobility of 10 $cm^2/V \cdot sec$ or less.

In the photoelectric conversion element, which includes the above-described preferable forms and configurations, according to an embodiment of the present invention, the first electrode formed from a transparent electrically conductive material may be disposed on a transparent substrate, the photoelectric conversion material layer may be disposed on the first electrode, and the second electrode may be disposed on the photoelectric conversion material layer. Such a configuration is referred to as a "first configuration photoelectric conversion element" for the sake of convenience. Alternatively, the first electrode may be disposed on a substrate, the photoelectric conversion material layer may be disposed on the first electrode, and the second electrode formed from a transparent electrically conductive material may be disposed on the photoelectric conversion material layer. Such a configuration is referred to as a "second configuration photoelectric conversion element" for the sake of convenience. Alternatively, the first electrode and the second electrode may be disposed on a substrate, and the photoelectric conversion material layer may be disposed over the first electrode and the second electrode on the substrate. Such a configuration is referred to as a "third configuration photoelectric conversion element" for the sake of convenience.

In the photoelectric conversion element in the photoelectric converter, which includes the above-described preferable forms and configurations, according to an embodiment of the present invention, or in the photoelectric conversion element, which includes the above-described preferable forms and configurations, according to an embodiment of the present invention (hereafter may be collectively referred to as "photoelectric conversion element and the like according to embodiments of the present invention", the photoelectric conversion material layer may be in an amorphous state or be in a crystalline state.

Examples of organic materials constituting the photoelectric conversion material layer may include organic semiconductor materials, specifically, organic colorants typified by quinacridone and derivatives thereof, colorants which are typified by Alq3 [tris(8-quinolinolato)aluminum (III)] and in which early-metal (referring to metals in the left side of the periodic table) ions are chelated with organic materials, and organometallic colorants which are typified by zinc(II) phthalocyanine and which are formed by complexation of transition metal ions and organic materials.

Alternatively, as for materials for constituting the photoelectric conversion material layer, organometallic compounds, organic semiconductor fine particles, metal oxide semiconductors, inorganic semiconductor fine particles, materials in which core members are covered with shell members, and organic-inorganic hybrid compounds may also be used. Here, specific examples of organometallic compounds may include colorants in which early-metal ions are chelated with organic materials and organometallic colorants which are formed by complexation of transition metal ions and organic materials, as described above.

Furthermore, specific examples of organic semiconductor fine particles include associated members of organic colorants typified by quinacridone and derivatives thereof, as described above; associated members of colorants in which early-metal ions are chelated with organic materials; associated members of organometallic colorants which are formed by complexation of transition metal ions and organic materials; Prussian blue in which metal ions are cross-linked with cyano groups and derivatives thereof; and complexes of the above-described associated members.

Moreover, specific examples of metal oxide semiconductors and inorganic semiconductor fine particles may include ITO, IGZO, ZnO, IZO, $IrO_2$, $TiO_2$, $SnO_2$, $SiO_x$, metal chalcogen semiconductors (specifically, CdS, CdSe, ZnS, CdSe/CdS, CdSe/ZnS, and PbSe) containing chalcogens [for example, sulfur (S), selenium (Se), and tellurium (Te)], ZnO, CdTe, GaAs, and Si.

The range of average particle diameter RAVE of the fine particles is not specifically limited. However, it is desirable that the range is $5.0 \times 10^{-10}$ m $\leq R_{AVE} \leq 1.0 \times 10^{-6}$ m, and preferably $5.0 \times 10^{-10}$ m $\leq R_{AVE} \leq 1.0 \times 10^{-7}$ m. It is desirable that the dispersibility into water and organic solvents is high. In addition, it is desirable that the absorption band of the fine particles is within the visible light region of 380 nm to 800 nm, within the near infrared light region of 800 nm to 1500 nm, or within the visible light region of 380 nm to 800 nm and the near infrared light region of 800 nm to 1500 nm. The shape of a fine particle may be a sphere, although not limited to this. Examples of other shapes may include a triangle, a tetrahedron, a cube, a rectangular parallelepiped, a cone, a circular cylinder (rod), a triangular prism, a fiber-like shape, and a pill-shaped fiber. In this regard, in the case where the shape of the fine particle is other than a sphere, the average particle diameter $R_{AVE}$ of the fine particles may be assumed to be the average value of diameters of virtual spheres having the same volumes as the measured volumes of the fine particles in the shapes other than a sphere. The average particle diameter $R_{AVE}$ of the fine particles may be obtained by measuring the particle diameters of the fine particles observed with, for example, a transmission electron microscope (TEM).

Furthermore, specific examples of materials in which core members are covered with shell members, that is, combinations of (core member, shell member), may include organic materials, such as (polystyrene, polyaniline), and metal materials, such as, (hard-to-ionize metal material, easy-to-ionize metal material).

Moreover, specific examples of organic-inorganic hybrid compounds may include Prussian blue, in which metal ions are cross-linked with cyano groups, and derivatives thereof. Other examples may include coordination polymers collectively referring to polymers in which metal ions are cross-linked with bipyridines endlessly, polymers in which metal ions are cross-linked with polyvalent ionic acids typified by oxalic acid and rubeanic acid, and the like.

Examples of methods for forming the photoelectric conversion material layer may include coating methods, physical vapor deposition methods (PVD methods), and various chemical vapor deposition methods (CVD methods) including an MOCVD method, although depending on the materials used. Here, specific examples of coating methods may include a spin coating method; a dipping method; a casting method; various printing methods, e.g., a screen printing method, an ink-jet printing method, an offset printing method, and a gravure printing method; a stamping method; a spray method; and various coating methods, e.g., an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calender coater method. In this regard, examples of solvents in the coating methods may include nonpolar or less polar organic solvents, e.g., toluene, chloroform, hexane, and ethanol. Furthermore, examples of PVD methods may include various vacuum evaporation methods, e.g., an electron beam heating method, a resistance heating method, and a flash evaporation method; a plasma evaporation method; various sputtering methods, e.g., a double pole sputtering method, a direct-current sputtering method, a direct-current magnetron sputtering method, a high-frequency sputtering method, a magnetron sputtering method, an ion beam sputtering method, and a bias sputtering method; and various ion plating methods; e.g., a direct current (DC) method, an RF method, a multi-cathode method, an activation reaction method, a field evaporation method, a high-frequency ion plating method, and a reactive ion plating method.

The thickness of the photoelectric conversion material layer is not limited but, $1 \times 10^{-10}$ m to $5 \times 10^{-7}$ m, for example, may be exemplified.

In the photoelectric conversion element and the like according to embodiments of the present invention, as for a voltage applied between the first electrode and the second electrode, a potential difference of 1 mV to 15 V, for example, may be exemplified, although depending on the material constituting the photoelectric conversion material layer. In this regard, when a constant amount of light is applied to the photoelectric conversion material layer, a current generated in the photoelectric conversion material layer changes with the lapse of an application time. Here, as for the application time of the constant amount of light, $1\times10^{-12}$ sec to $1\times10^{-1}$ sec, for example, may be exemplified, although depending on the material constituting the photoelectric conversion material layer. In this regard, the current generated in the photoelectric conversion material layer changes with the lapse of an application time. This change depends on the material constituting the photoelectric conversion material layer and is not determined univocally. However, the change may be examined by conducting various tests.

The time constant $\tau(P)$ in a current decreasing period of the change in the current is represented as a function of the amount of light applied to the photoelectric conversion material layer per unit time. The above-described function of the amount of light is obtained by conducting various tests. The resulting function of the amount of light may be stored in, for example, the current detection circuit. Likewise, the relationship between the current $I_{dec}$ in the current decreasing period of the change in the current and the amount of light applied to the photoelectric conversion material layer per unit time is obtained by conducting various tests. The resulting relationship may be stored in, for example, the current detection circuit as well. In the preferable configuration, the current detection circuit determines the integral of the current by evaluating the integral of the formula (1). In this regard, the amount of light may be determined on the basis of the integral of the current (including a physical value calculated on the basis of the integral of the current) by evaluating the integral of only the first term of the formula (1). Alternatively, the amount of light may be determined on the basis of the integral of the current (including a physical value calculated on the basis of the integral of the current) by evaluating the integral of the first term and the second term of the formula (1). The relationship between the integral of the current (including a physical value calculated on the basis of the integral of the current) and the amount of light may also be stored in, for example, the current detection circuit.

The current detection circuit may be any current detection circuit having a configuration and a structure in the related art insofar as the $\tau(P)$ is calculated and the $I_{dec}$ is determined.

The first electrode and the second electrode are disposed discretely. This discrete state include the form in which the second electrode is disposed above the first electrode (the first configuration or the second configuration photoelectric conversion element) and the form in which the first electrode and the second electrode are disposed on the substrate while being opposed to each other (the third configuration photoelectric conversion element).

The photoelectric conversion element and the like according to embodiments of the present invention are not limited to have a two-terminal electronic device structure provided with the first electrode and the second electrode, but may have a three-terminal electronic device structure further provided with a control electrode. Modulation of the passing current may be conducted by applying a voltage to the control electrode. Specific examples of three-terminal electronic device structures may include the same configurations and structures as those of a so-called bottom gate/bottom contact type, a bottom gate/top contact type, a top gate/bottom contact type, and a top gate/top contact type field effect transistors (FETs).

More specifically, the photoelectric conversion element and the like having the bottom gate/bottom contact type three-terminal electronic device structure, according to embodiments of the present invention, include (a) a control electrode (corresponding to a gate electrode) disposed on a support member, (b) an insulating layer (corresponding to a gate insulating layer) disposed on the control electrode and the support member, (c) first/second electrodes (corresponding to source/drain electrodes) disposed on the insulating layer, and (d) a photoelectric conversion material layer (corresponding to a channel formation region) disposed on the insulating layer and between the first/second electrodes.

Furthermore, the photoelectric conversion element and the like having the bottom gate/top contact type three-terminal electronic device structure, according to embodiments of the present invention, include (a) a control electrode (corresponding to a gate electrode) disposed on a support member, (b) an insulating layer (corresponding to a gate insulating layer) disposed on the control electrode and the support member, (c) a photoelectric conversion material layer (corresponding to a channel formation region) and a photoelectric conversion material layer extension portion disposed on the insulating layer, and (d) first/second electrodes (corresponding to source/drain electrodes) disposed on the photoelectric conversion material layer extension portion.

Furthermore, the photoelectric conversion element and the like having the top gate/bottom contact type three-terminal electronic device structure, according to embodiments of the present invention, include (a) first/second electrodes (corresponding to source/drain electrodes) disposed on a support member, (b) a photoelectric conversion material layer (corresponding to a channel formation region) disposed on the support member between the first/second electrodes, (c) an insulating layer (corresponding to a gate insulating layer) disposed on the first/second electrodes and the photoelectric conversion material layer, and (d) a control electrode (corresponding to a gate electrode) disposed on the insulating layer.

Furthermore, the photoelectric conversion element and the like having the top gate/top contact type three-terminal electronic device structure, according to embodiments of the present invention, include (a) a photoelectric conversion material layer (corresponding to a channel formation region) and a photoelectric conversion material layer extension portion disposed on a support member, (b) first/second electrodes (corresponding to source/drain electrodes) disposed on the photoelectric conversion material layer extension portion, (c) an insulating layer (corresponding to a gate insulating layer) disposed on the first/second electrodes and the photoelectric conversion material layer, and (d) a control electrode (corresponding to a gate electrode) disposed on the insulating layer.

Examples of transparent electrically conductive materials constituting the first electrode or the second electrode may include indium-tin oxides (including ITO, Sn-doped $In_2O_3$, crystalline ITO, and amorphous ITO), IFO (F-doped $In_2O_3$), tin oxide ($SnO_2$), ATO (Sb-doped $SnO_2$), FTO (F-doped $SnO_2$), zinc oxide (including Al-doped ZnO, B-doped ZnO, and Ga-doped ZnO), indium oxide-zinc oxide (IZO), titanium oxide ($TiO_2$), spinel type oxides, and oxides having a $YbFe_2O_4$ structure. The first electrode or the second electrode formed from such a material usually has a high work function and performs a function as an anode. Examples of methods for forming the transparent electrode may include PVD methods, e.g., a vacuum evaporation method, a reactive evaporation method, various sputtering methods, electron beam evaporation method, and an ion plating method; a pyrosol method; a method in which an organometallic compound is thermally decomposed; a spray method; a dipping method; various CVD methods including a MOCVD method; an electroless plating method; and electroplating method, although depending on the material constituting the transparent electrode.

Moreover, in the case where the transparency is not specifically desired and the first electrode or the second electrode functions as an anode (positive electrode), that is, an electrode for taking holes, the electrically conductive material for constituting the first electrode or the second electrode is preferably an electrically conductive material having a high work function (for example, $\phi$=4.5 eV to 5.5 eV). Specific examples may include gold (Au), silver (Ag), chromium (Cr), nickel (Ni), palladium (Pd), platinum (Pt), iron (Fe), iridium (Ir), germanium (Ge) osmium (Os), rhenium (Re), and tellurium (Te). On the other hand, in the case where the first electrode or the second electrode functions as a cathode (negative electrode), that is, an electrode for taking electrons, the electrically conductive material for constituting the first electrode or the second electrode has preferably a low work function (for example, $\phi$=3.5 eV to 4.5 eV). Specific examples may include alkali metals (for example, Li, Na, and K) and fluorides or oxides thereof, alkaline earth metals (for example, Mg and Ca) and fluorides or oxides thereof, aluminum (Al), zinc (Zn), tin (Sn), thallium (Tl), sodium-potassium alloys, aluminum-lithium alloys, magnesium-silver alloys, rare-earth metals, e.g., indium and ytterbium, and alloys thereof.

Alternatively, examples of materials for constituting the first electrode, the second electrode, and the control electrode may include electrically conductive materials, such as metals, e.g., platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing these metal elements, electrically conductive particles formed from these metals, electrically conductive particles of alloys containing these metals, polysilicon containing impurities, carbon based materials, oxide semiconductors, carbon-nanotubes, and graphene. A lamination structure of layers containing these elements may be employed. In addition, as for the material for constituting the first electrode, the second electrode, and the control electrode, organic materials (electrically conductive polymers), e.g., poly(3,4-ethylenedioxythiophene)/polystyrenesulfonate (DEPOT/PSS), may be mentioned.

The method for forming the first electrode, the second electrode, or the control electrode may be any one of the above-described various PVD methods; various CVD methods including the MOCVD method; the above-described various coating methods; a lift-off method; a sol-gel method; an electrodeposition method; a shadow mask method; plating methods, e.g., an electroplating method, an electroless plating method, and combinations thereof; and spray method or a combination with patterning technology, as necessary, although depending on the material constituting them.

As for the substrate or the support member (hereafter may be collectively referred to as substrate and the like), organic polymers (having a form of a polymer material, such as a plastic film, a plastic sheet, or a plastic substrate, which is formed from a polymer material and which exhibits the flexibility) exemplified by polymethyl methacrylate (PMMA), polyvinyl alcohol (PVA), polyvinylphenol (PVP), polyether sulfone (PES), polyimide, polycarbonate (PC), polyethylene terephthalate (PET), and polyethylene naphthalate, are mentioned. Alternatively, mica may be mentioned. In the case where the substrate and the like formed from the above-described flexible polymer material is used, incorporation of an electronic device into an electronic apparatus having a curved shape or integration thereof is made possible. Alternatively, examples of substrate and the like may include various glass substrates, various glass substrates provided with insulating films on the surfaces, quartz substrates, quartz substrates provided with insulating films on the surfaces, silicon substrates provided with insulating films on the surfaces, and metal substrates formed from various alloys, e.g., stainless steel, and various metals. Furthermore, examples of insulating films may include silicon oxide based materials (for example, $SiO_x$ and spin on glass (SOG)); silicon nitride ($SiN_y$); silicon oxynitride (SiON); aluminum oxide ($Al_2O_3$); and metal oxides and metal salts. Moreover, electrically conductive substrates (substrates formed from metals, e.g., gold and aluminum, and substrates formed from highly oriented graphite) provided with these insulating films on the surfaces may also be used. It is desirable that the surfaces of the substrate and the like are smooth. However, it is acceptable that there is roughness to the extent of not adversely affecting the characteristics of the photoelectric conversion material layer. The adhesion of the first electrode, the second electrode, and the control electrode to the substrate and the like may be improved by forming a silanol derivative on the surfaces of the substrate and the like by a silane coupling method or forming a thin film from an insulative metal salt or metal complex by a CVD method or the like. The transparent substrate refers to a substrate formed from a material which does not excessively absorb the light incident on the photoelectric conversion material layer through the substrate.

In some cases, the electrode and the photoelectric conversion material layer may be covered with a cover layer. Examples of materials constituting the cover layer may include not only inorganic insulating materials exemplified by silicon oxide based materials; silicon nitride ($SiN_y$); and metal oxide high dielectric constant insulating films, e.g., aluminum oxide ($Al_2O_3$), but also organic insulating materials (organic polymers) exemplified by polymethyl methacrylate (PMMA); polyvinylphenol (PVP); polyvinyl alcohol (PVA); polyimide; polycarbonate (PC); polyethylene terephthalate (PET); polystyrene; silanol derivatives (silane coupling agents), e.g., N-2(aminoethyl)3-aminopropyltrimethoxysilane (AEAPTMS), 3-mercaptopropyltrimethoxysilane (MPTMS), and octadecyltrichlorosilane (OTS); and straight chain hydrocarbons having a functional group, which can be bonded to the control electrode, at one end, e.g., octadecanethiol and dodecyl isocyanate. These materials may be used in combination. In this regard, examples of silicon oxide based materials may include silicon oxide ($SiO_x$), BPSG, PSG, BSG, AsSG, PbSG, silicon oxynitride (SiON), spin on glass (SOG), and low dielectric constant materials (for example, polyaryl ether, cycloperfluorocarbon polymer and benzocyclobutene, cyclic fluororesin, polytetrafluoroethylene, fluorinated aryl ether, fluorinated polyimide, amorphous carbon, and organic SOG).

Examples of materials constituting the insulating layer may include not only inorganic insulating materials exemplified by silicon oxide based materials; silicon nitride ($SiN_y$);

and metal oxide high dielectric constant insulating films, e.g., aluminum oxide ($Al_2O_3$), but also organic insulating materials (organic polymers) exemplified by polymethyl methacrylate (PMMA); polyvinylphenol (PVP); polyvinyl alcohol (PVA); polyimide; polycarbonate (PC); polyethylene terephthalate (PET); polystyrene; silanol derivatives (silane coupling agents), e.g., N-2(aminoethyl)3-aminopropyltrimethoxysilane (AEAPTMS), 3-mercaptopropyltrimethoxysilane (MPTMS), and octadecyltrichlorosilane (OTS); and straight chain hydrocarbons having a functional group, which can be bonded to the control electrode, at one end, e.g., octadecanethiol and dodecyl isocyanate. These materials may be used in combination. In this regard, examples of silicon oxide based materials may include silicon oxide ($SiO_x$), BPSG, PSG, BSG, AsSG, PbSG, silicon oxynitride (SiON), spin on glass (SOG), and low dielectric constant materials (for example, polyaryl ether, cycloperfluorocarbon polymer and benzocyclobutene, cyclic fluororesin, polytetrafluoroethylene, fluorinated aryl ether, fluorinated polyimide, amorphous carbon, and organic SOG).

The method for forming the insulating layer may be any one of the above-described various PVD methods; various CVD methods; a spin coating method; the above-described various coating methods; a sol-gel method; an electrodeposition method; a shadow mask method; and spray method. Alternatively, the insulating layer may be formed by oxidizing or nitriding the surface of the control electrode or be obtained by forming an oxide film or a nitride film on the surface of the control electrode. Examples of methods for oxidizing the surface of the control electrode may include an oxidation method by using $O_2$ plasma and an anodizing method, although depending on the material constituting the control electrode. Furthermore, examples of methods for nitriding the surface of the control electrode may include a nitriding method by using $N_2$ plasma, although depending on the material constituting the control electrode. Alternatively, regarding, for example, a Au electrode, an insulating layer may be formed on the surface of the control electrode by covering the control electrode surface through self-organization with insulating molecules having a functional group capable of being chemically bonded to the control electrode, such as a straight-chain hydrocarbon having one end modified with a mercapto group, by a dipping method or the like. Alternatively, the insulating layer may also be formed by modifying the surface of the control electrode with a silanol derivative (silane coupling agent).

Solid-state imaging element of an imaging device (solid-state imaging device), e.g., an optical sensor, an image sensor, or a television camera, may be formed by using the photoelectric converter, the photoelectric conversion element, or the like according to an embodiment of the present invention.

In general, the photoelectric conversion element by using a Si based semiconductor material used for the photoelectric conversion material layer has very low resistance. On the other hand, in general, for example, the metal oxide thin film and the organic material thin film have high resistance and a large charge accumulation capacity regardless of the crystallinity thereof as compared with those of the Si based semiconductor material. Therefore, when light is applied to the photoelectric conversion material layer while a voltage is applied to the photoelectric conversion material layer, the charges is accumulated in the photoelectric conversion material layer. Since the time constant τ in the photoelectric conversion material layer is sufficiently large (on the order of several microseconds to several milliseconds), the transient charge and discharge current generated in the photoelectric conversion material layer can be observed.

In the photoelectric conversion element and the like according to embodiments of the present invention, when a constant amount of light is applied to the photoelectric conversion material layer while a voltage is applied between the first electrode and the second electrode (that is, while a bias voltage is applied between the first electrode and the second electrode), a current generated in the photoelectric conversion material layer changes with the lapse of an application time. Consequently, a photoelectric conversion element and the like having high sensitivity and high S/N ratio can be provided by detecting the above-described change in the current. That is, the amount of received light can be determined on the basis of the discharge current, and the discharge current provides a large signal as compared with that of a steady-state current. Therefore, a photoelectric conversion element and the like can be provided while having advantages that the amount of received light can be calculated from a weak signal in low voltage drive (2 V or less) in which the S/N ratio decreases and the amount of light can be reliably calculated even when the amount of light is very small and the S/N ratio decreases because of the characteristics of the discharge current. When the light is applied to the photoelectric conversion material layer, regarding the current-time response and the dependence on the amount of light in the application of light, the current area (the integral of the current with respect to time) of the transient discharge current is dependent on the amount of light and, in addition, the time constant τ of the transient discharge current increases in the region of a small amount of light.

BRIEF DESCRIPTION OF THE DRAWINGS

FIGS. 6A and 6B are schematic partial sectional views of photoelectric conversion elements having two-terminal electronic device structures in Example 2 and Example 3, respectively;

DESCRIPTION OF THE PREFERRED EMBODIMENTS

The present invention will be described below on the basis of the examples with reference to the drawings.

EXAMPLE 1

Figure 1:
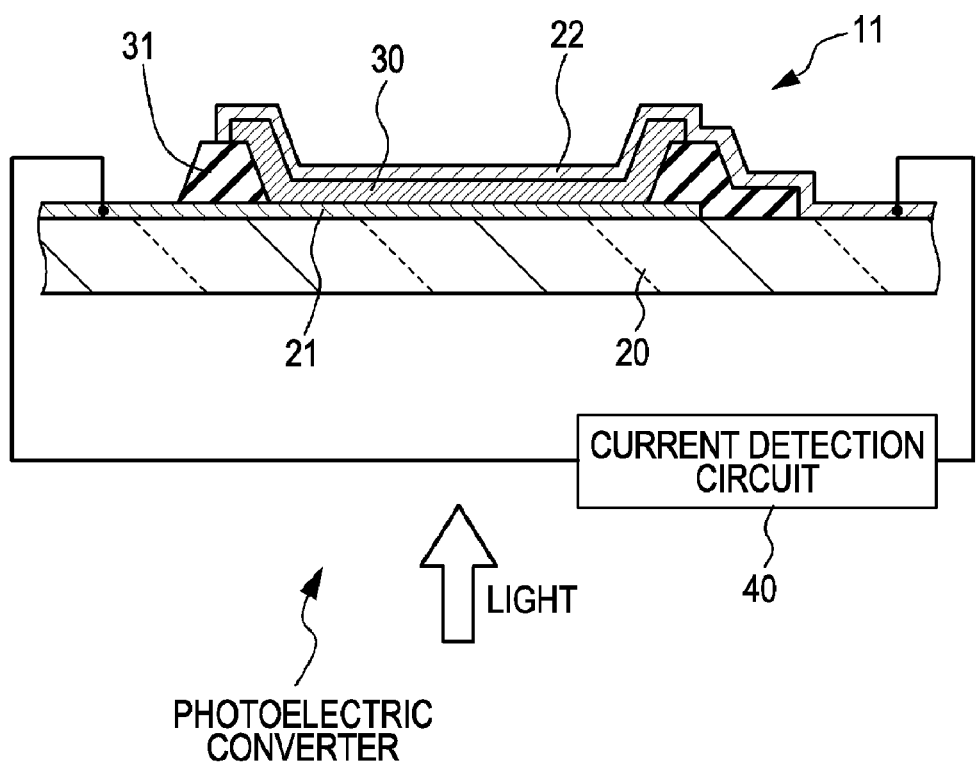
FIG. 1 is a schematic sectional view of a photoelectric conversion element having a two-terminal electronic device structure in Example 1.

Example 1 relate to a photoelectric converter and a photoelectric conversion element according to embodiments of the present invention. In particular, the photoelectric conversion element in Example 1 is a first configuration photoelectric conversion element. As is indicated by a schematic sectional view shown in FIG. 1, a photoelectric conversion element 11 in Example 1 includes (A) a first electrode 21 and a second electrode 22 disposed discretely and (B) a photoelectric conversion material layer 30 disposed between the first electrode 21 and the second electrode 22. Furthermore, a photoelectric converter in Example 1 includes the photoelectric conversion element 11 and, in addition, includes a current detection circuit 40.

Then, in the photoelectric conversion element 11 in Example 1 or in the photoelectric conversion element 11 constituting the photoelectric converter in Example 1, when a constant amount of light is applied to the photoelectric conversion material layer 30 while a voltage is applied between the first electrode 21 and the second electrode 22, a current generated in the photoelectric conversion material layer 30 changes with the lapse of an application time. Furthermore, in the photoelectric converter in Example 1, a current detection circuit 40 detects the change in the current. The current detection circuit 40 is connected to the first electrode 21 and the second electrode 22 and applies a voltage to the first electrode 21 and the second electrode 22.

In the photoelectric conversion element 11 in Example 1, the first electrode 21 formed from a transparent electrically conductive material is disposed on a transparent substrate 20. The photoelectric conversion material layer 30 is disposed on the first electrode 21, and the second electrode 22 is disposed on the photoelectric conversion material layer 30. Here, the light is incident on the photoelectric conversion material layer 30 through the substrate 20 and the first electrode 21.

The substrate 20 is formed from a glass substrate having a thickness of 0.7 mm, the first electrode 21 is formed from a transparent electrically conductive material (specifically, ITO having a thickness of 120 nm), and the second electrode 22 is formed from aluminum (Al) having a thickness of 100 nm. The photoelectric conversion material layer 30 is formed from an organic material, specifically an organic semiconductor material (more specifically, quinacridone having a thickness of 50 nm). In this regard, the photoelectric conversion material layer 30 has a carrier mobility of 10 $cm^2/V \cdot sec$ or less (for example, about $10^{-3}$ $cm^2/V \cdot sec$ to $10^{-6}$ $cm^2/V \cdot sec$).

The photoelectric conversion element 11 in Example 1 may be produced by a method described below. That is, initially, the first electrode 21 is formed from ITO having a thickness of 120 nm on the substrate 20 on the basis of lithography by using a photomask. Subsequently, a convex portion 31 is formed from an insulating material on the substrate 20 and the first electrode 21. Thereafter, the photoelectric conversion material layer 30 is formed from quinacridone having a thickness of 50 nm over the first electrode 21 and the convex portion 31 by a vacuum evaporation method. Then, the second electrode 22 is formed from aluminum having a thickness of 100 nm over the photoelectric conversion material layer 30 and the substrate 20 by a PVD method through the use of a metal mask. In this regard, the convex portion 31 is formed in such a way as to surround a region, in which the substrate 20 is to be formed, of the substrate 20.

A constant amount of light with a wavelength of 565 nm was applied to the thus obtained photoelectric conversion material layer 30 of the photoelectric conversion element 11 in Example 1 through the transparent substrate 20 and the first electrode 21. In this regard, 0.5 V was applied to the first electrode 21 while the second electrode 22 was grounded. At this time, the current generated in the photoelectric conversion material layer 30 changed with the lapse of the application time. That is, in the photoelectric conversion element 11, the change in the current in the photoelectric conversion material layer 30 with the lapse of the application time corresponds to a change in a transient current passing a capacitor, where it is assumed that the first electrode 21, the photoelectric conversion material layer 30, and the second electrode 22 constitute the capacitor. Consequently, a transient charge and discharge current was generated in the photoelectric conversion element 11. Here, when the time constant in a current decreasing period of the change in the current is assumed to be $\tau(P)$, the current $I_{dec}$ in the current decreasing period is represented by $$I_{dec} = C_1 \cdot I_0(P) \cdot \exp\{-t/\tau(P)\} + C_2 \qquad (1)$$

where "t" represents an elapsed time from a current decreasing period starting time, at which transition from a current increasing period to the current decreasing period occurs in the change in the current and at which t is assumed to be 0, "$I_0(P)$" represents a current generated in the photoelectric conversion material layer 30 when a constant amount of light is applied to the photoelectric conversion material layer 30 at t=0, and $C_1$ and $C_2$ represents independently a constant. Then, the $I_{dec}$ was determined in the current detection circuit 40. That is, the transient charge and discharge current was detected with the current detection circuit 40, according to the related art, connected to the first electrode 21 and the second electrode 22. In this regard, in the photoelectric converter, the current detection circuit 40 determines the integral of the current (in Example 1, the amount of charge which is a physical value calculated on the basis of the integral of the current) by evaluating the integral from 0 to, for example, 100 milliseconds, at the maximum, of the formula (1) with respect to t. Moreover, in the photoelectric conversion element 11, the integral of the current (in Example 1, the amount of charge which is a physical value calculated on the basis of the integral of the current) determined by evaluating the integral from 0 to, for example, 100 milliseconds, at the maximum, of the formula (1) with respect to t exhibits the dependence on the amount of light. In addition, the $\tau(P)$ was calculated in the current detection circuit 40.

Figure 2:
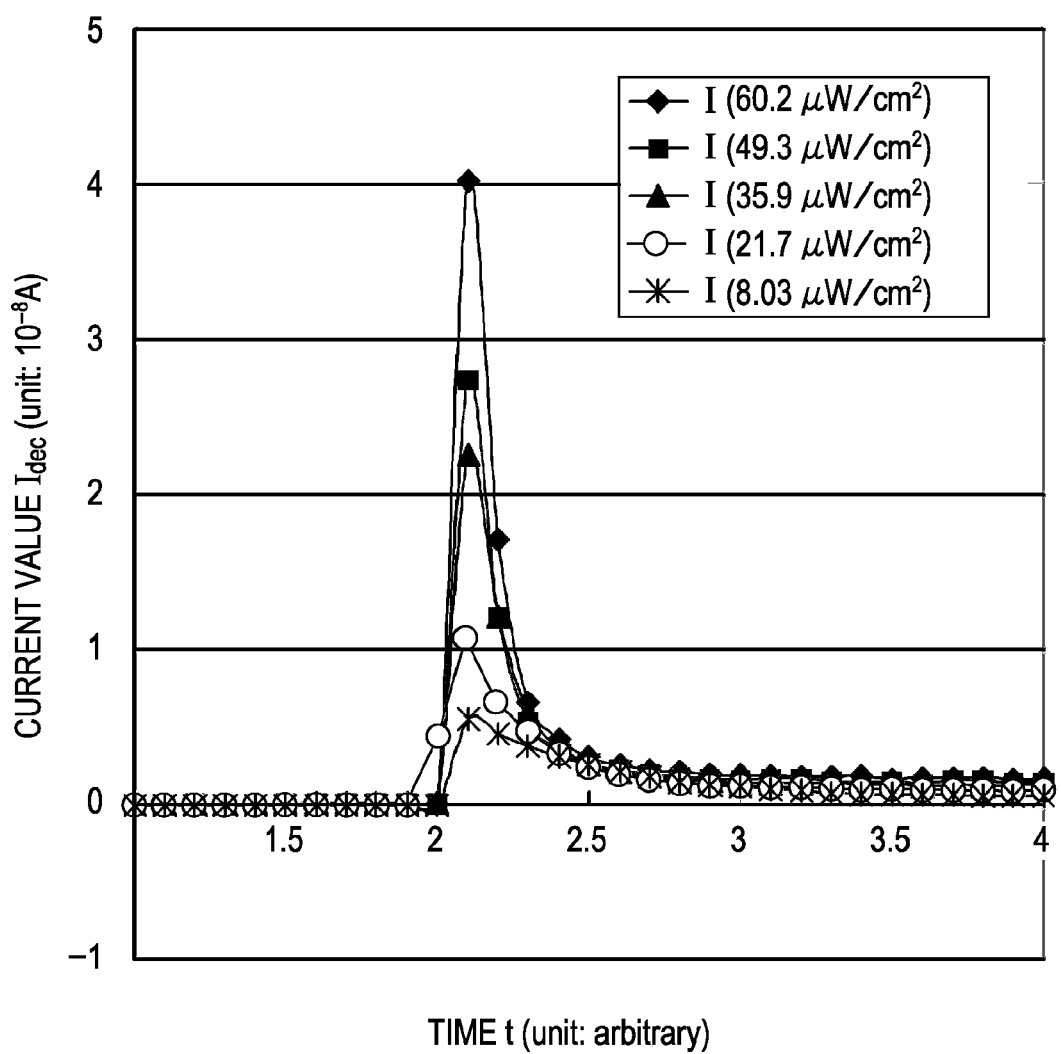
FIG. 2 is a graph showing the relationship between the amount of transient charge and discharge current and the amount of light and the relationship between the integral of the current $I_{dec}$ and the amount of light of the photoelectric conversion element in Example 1.
Figure 3:
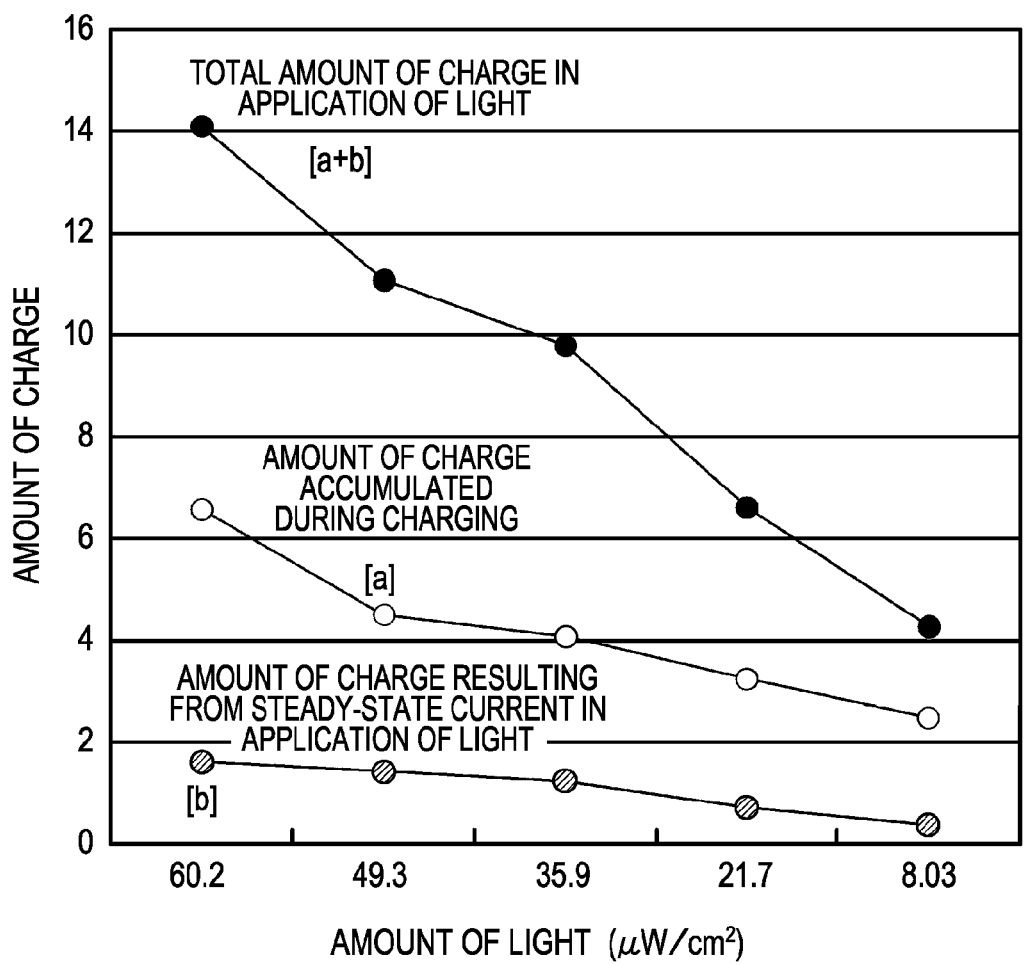
FIG. 3 is a graph showing the relationship between the amount of charge determined from the integral of the current $I_{dec}$ and the amount of light of the photoelectric conversion element in Example 1.
Figure 4:
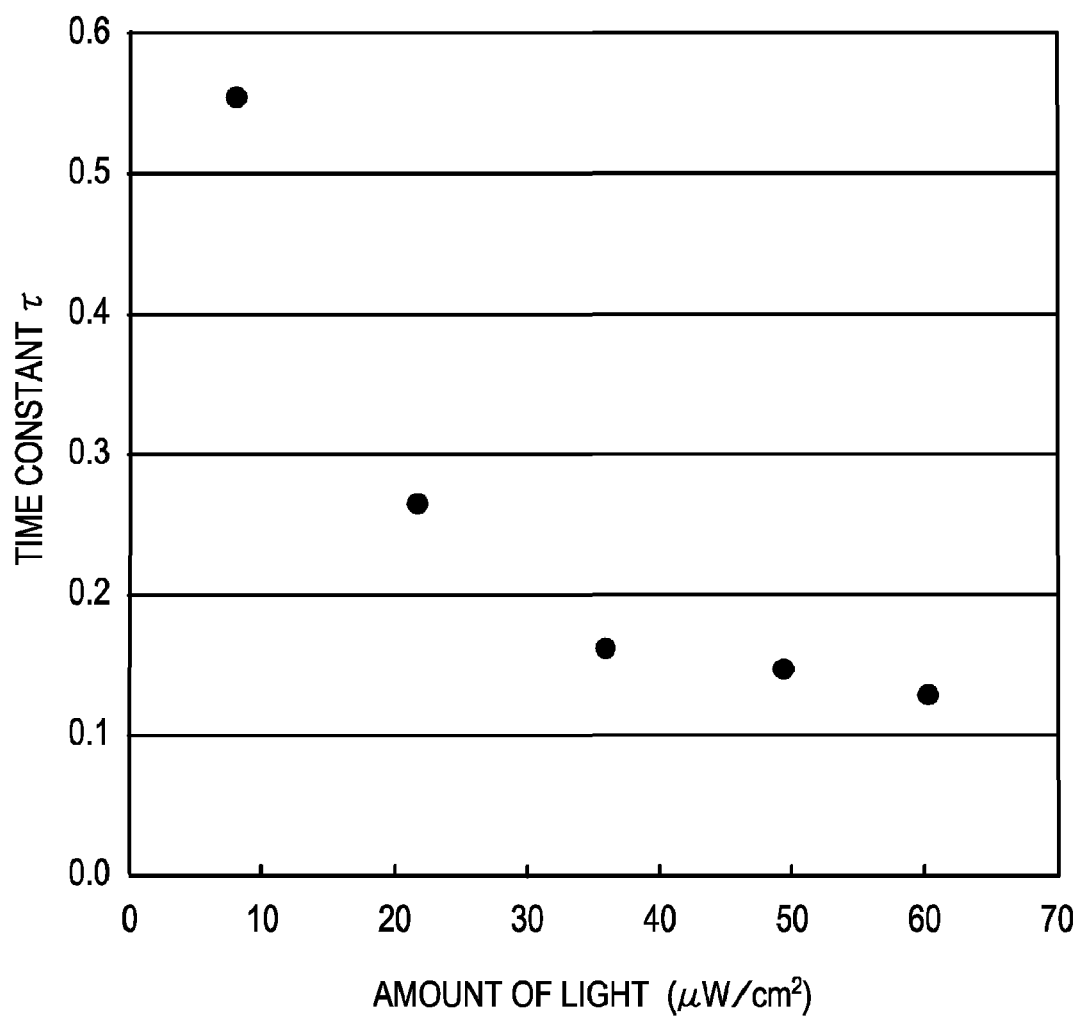
FIG. 4 is a graph showing the relationship between the time constant τ(P) calculated from the amount of transient charge and discharge current and the amount of light.
Figure 5:
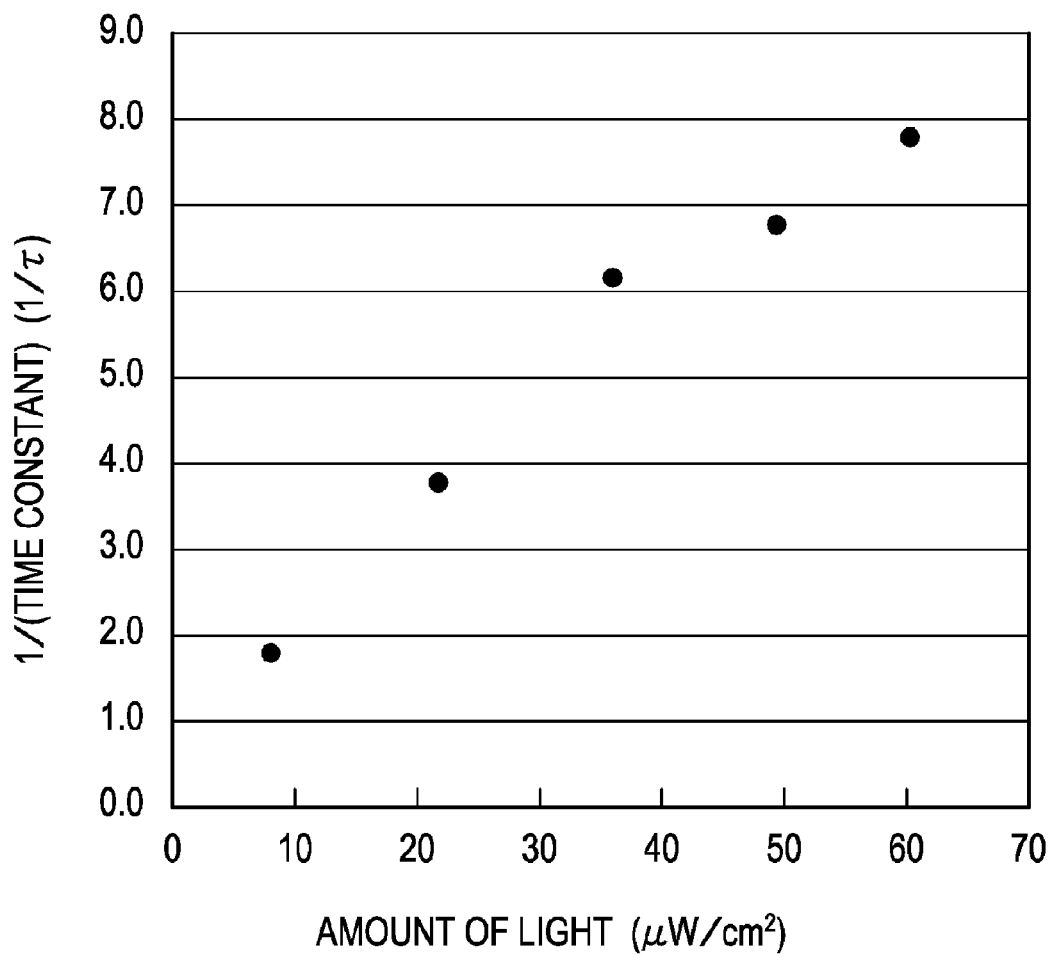
FIG. 5 is a graph showing the relationship between the reciprocal of the time constant τ(P) calculated from the amount of transient charge and discharge current and the amount of light.

FIG. 2 shows the relationship between the thus obtained amount of transient charge and discharge current (current $I_{dec}$) and the amount of light. Here, the horizontal axis in FIG. 2 indicates the above-described time t (unit: arbitrary), and the vertical axis in FIG. 2 indicates the above-described current $I_{dec}$ (unit: $10^{-8}$ A). FIG. 3 shows the relationship between the amount of charge determined from the integral of the current $I_{dec}$ and the amount of light. In FIG. 3, "a+b" indicates the amount of charge determined from the integral of the first term and the second term of the formula (1), "a" indicates the amount of charge determined from the integral of only the first term of the formula (1), and "b" indicates the amount of charge determined from the integral of only the second term of the formula (1). Here, the horizontal axis in FIG. 3 indicates the amount of light (unit: microwatt/$cm^2$) applied to the photoelectric conversion material layer 30, and the vertical axis in FIG. 3 indicates the amount of charge (unit: arbitrary) determined on the basis of the integral from 0 to a predetermined sufficiently long lapse time of the current $I_{dec}$ with respect to t. In addition, FIG. 4 shows the relationship between the time constant $\tau(P)$ calculated from the amount of transient charge and discharge current (current $I_{dec}$) and the amount of light. FIG. 5 shows the relationship between the reciprocal of the time constant $\tau(P)$ calculated from the amount of transient charge and discharge current and the amount of light. In this regard, the horizontal axes in FIG. 4 and FIG. 5 indicate the amount of light (unit: microwatt/cm$^2$), the vertical axis in FIG. 4 indicates the time constant $\tau(P)$ (unit: arbitrary), and the vertical axis in FIG. 5 indicates the reciprocal of the time constant $\tau(P)$.

As is clear from FIG. 2, the peak value $I_0(P)$ of the amount of transient charge and discharge current is dependent on the amount of light. Furthermore, as is clear from FIG. 3, the amount of charge determined from the integral of the first term and the second term of the formula (1) or the amount of charge determined from the integral of the first term of the formula (1) is dependent on the amount of light significantly. Moreover, as is clear from FIG. 4, the time constant $\tau(P)$ is dependent on the amount of light. That is, the time constant $\tau(P)$ is represented as a function of the amount of light applied to the photoelectric conversion material layer 30 per unit time. Here, as is clear from FIG. 5, the reciprocal of the time constant $\tau(P)$ may be represented by a linear function of the amount P of light, as described below. However, such a linear function is no more than an exemplification.

In addition, in the case where the amount of charge determined from the integral of the first term and the second term is represented by $CHG_{1+2}(P)$, which is a function of the amount P of light, or the amount of charge determined from the integral of only the first term of the formula (1) is represented by $CHG_1(P)$, which is a function of the amount P of light, the amount of charge may be represented by a linear function of the amount P of light, as described below. However, such linear functions are no more than exemplifications.

$$1/\{\tau(P)\}=0.114 \cdot P + 1.2657$$

$$CHG_{1+2}(P)=-2.414\times10^{-9} \cdot P + 1.642\times10^{-8}$$

$$CHG_1(P)=-9.444\times10^{-10} \cdot P + 7.013\times10^{-9}$$

In this regard, the function of the integral of the current $I_{dec}$, the function of the amount of charge determined from the integral of the first term and the second term of the formula (1), the function of the amount of charge determined from the integral of the first term of the formula (1), and the time constant $\tau(P)$, in which the variable is the amount of light, are dependent on the configuration, the structure, and the constituent material of the photoelectric conversion element 11. Therefore, whenever the configuration, the structure, and the constituent material of the photoelectric conversion element are changed, various tests may be conducted, these functions may be determined, and these functions may be stored in the current detection circuit 40. Alternatively, these functions may be tabulated and stored in the current detection circuit 40.

In the photoelectric conversion element 11 in Example 1, when a constant amount of light is applied to the photoelectric conversion material layer 30 while a bias voltage is applied between the first electrode 21 and the second electrode 22, a current generated in the photoelectric conversion material layer 30 changes transiently with the lapse of an application time. Consequently, a photoelectric conversion element having high sensitivity and high S/N ratio can be obtained by detecting the above-described change in the current. That is, the amount of received light can be calculated from even a weak signal and the amount of light can be reliably calculated even when the amount of light is very small and the S/N ratio decreases. In this regard, the current area (the integral of the current with respect to time) of the transient discharge current or the physical value calculated on the basis of the integral of the current is dependent on the amount of light and, in addition, the time constant $\tau$ of the transient discharge current increases in the region of small amounts of light.

EXAMPLE 2

Example 2 is a modification of Example 1. The photoelectric conversion element 12 in Example 2 is a second configuration photoelectric conversion element. That is, as is indicated by a schematic partial sectional view shown in FIG. 6A, a first electrode 21A is disposed on a substrate 20A, a photoelectric conversion material layer 30 is disposed on the first electrode 21A, and a second electrode 22A formed from a transparent material is disposed on the photoelectric conversion material layer 30. The light is incident on the photoelectric conversion material layer 30 through the second electrode 22A. Here, specifically, the substrate 20A is formed from, for example, a silicon semiconductor substrate, the first electrode 21A is formed from aluminum, and the second electrode 22A is formed from ITO. The configuration and the structure of the photoelectric conversion element 12 or a photoelectric converter in Example 2 may be the same configuration and structure as those of the photoelectric conversion element 11 or the photoelectric converter in Example 1 except the above-described points. Therefore, detailed explanations will not be provided.

EXAMPLE 3

Example 3 is also a modification of Example 1. The photoelectric conversion element 13 in Example 3 is a third configuration photoelectric conversion element. That is, as is indicated by a schematic partial sectional view shown in FIG. 6B, a first electrode 21B and a second electrode 22B are disposed on a substrate. A photoelectric conversion material layer 30 is disposed on the substrate 20B while extending from the first electrode 21B to the second electrode 22B. The light is incident on the photoelectric conversion material layer 30 through the second electrode 22B. Alternatively, the light is incident on the photoelectric conversion material layer 30 through the substrate 20B and the first electrode 21B. Here, specifically, the substrate 20B is formed from, for example, a silicon semiconductor substrate, the first electrode 21B and the second electrode 22B are formed from a metal material or a transparent electrically conductive material. The configuration and the structure of the photoelectric conversion element 13 or a photoelectric converter in Example 3 may be the same configuration and structure as those of the photoelectric conversion element 11 or the photoelectric converter in Example 1 except the above-described points. Therefore, detailed explanations will not be provided.

EXAMPLE 4

Example 4 is also a modification of Example 1. In Example 1 to Example 3, the photoelectric conversion elements had two-terminal electronic device structures including the first electrode 21 and the second electrode 22. On the other hand, in Example 4 or Example 5 to Example 7 described later, a photoelectric conversion element has a three-terminal electronic device structure further including a control electrode.

Modulation of the passing current can be conducted by applying a voltage to the control electrode. In Example 4, specifically, the same configuration and the structure as those of a bottom gate/bottom contact type FET were adopted as a three-terminal electronic device structure.

Figure 7A:
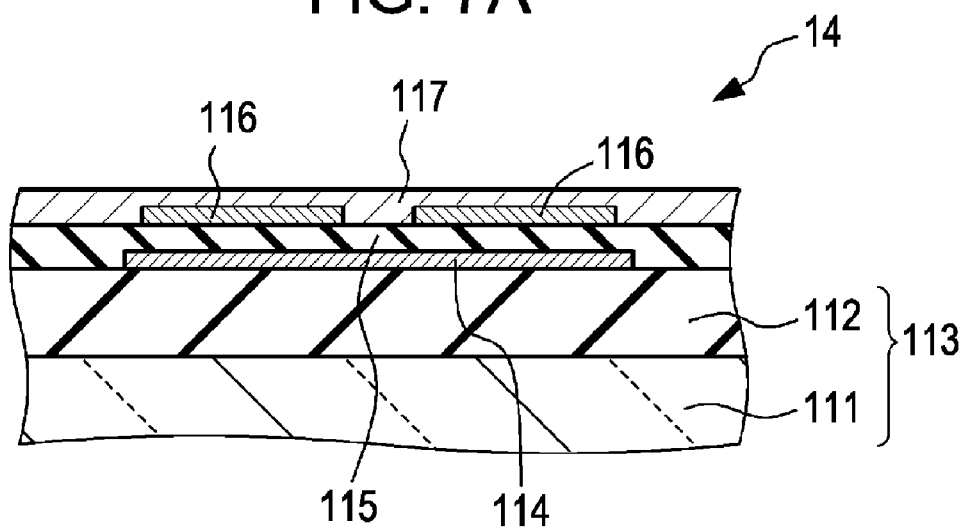
FIGS. 7A and 7B are schematic partial sectional views of photoelectric conversion elements having three-terminal electronic device structures in Example 4 and Example 5, respectively.

More specifically, as is indicated by a schematic partial sectional view shown in FIG. 7A, a photoelectric conversion element 14 having a bottom gate/bottom contact type three-terminal electronic device structure in Example 4 includes (a) a control electrode (corresponding to a gate electrode 114) disposed on a support member 113, (b) an insulating layer (corresponding to a gate insulating layer 115) disposed on the control electrode (gate electrode 114) and the support member 113, (c) first/second electrodes (corresponding to source/drain electrodes 116) disposed on the insulating layer (gate insulating layer 115), and (d) a photoelectric conversion material layer (corresponding to a channel formation region 117) disposed between the first/second electrodes (source/drain electrodes 116) and on the insulating layer (gate insulating layer 115).

In this regard, the control electrode (gate electrode 114) is formed from gold, the insulating layer (gate insulating layer 115) is formed from $Si_2$, and the support member 113 is formed from a silicon semiconductor substrate 111 and an insulating film 112 disposed thereon. Furthermore, the first/second electrodes (source/drain electrodes 116) and the photoelectric conversion material layer (channel formation region 117) are formed from the same materials as those for the first electrode 21B, the second electrode 22B, and the photoelectric conversion material layer 30 in Example 3. Moreover, the first/second electrodes (source/drain electrodes 116) are connected to a current detection circuit 40 although not shown in the drawing. The same goes for the following examples.

An outline of a method for manufacturing the photoelectric conversion element 14 in Example 4 will be described below.

Step-400

Initially, the gate electrode 114 is formed on the support member 113. Specifically, a resist layer (although the resist film is not shown in the drawing), from which the portion to be provided with the gate electrode 114 has been removed, is formed on the insulating film 112 on the basis of the lithography. Thereafter, a chromium (Cr) layer (not shown in the drawing) serving as an adhesion layer and a gold (Au) layer serving as the gate electrode 114 are formed all over the surface by a vacuum evaporation method sequentially. Subsequently, the resist layer is removed. In this manner, the gate electrode 114 is obtained on the basis of a so-called lift-off method.

Step-410

Then, the gate insulating layer 115 is formed on the support member 113 including the gate electrode 114. Specifically, the gate insulating layer 115 is formed from $SiO_2$ on the gate electrode 114 and the insulating film 112 on the basis of a sputtering method. In the film formation of the gate insulating layer 115, a lead portion (not shown in the drawing) of the gate electrode 114 may be formed without the photolithography process by covering a part of the gate electrode 114 with a hard mask.

Step-420

Next, the source/drain electrodes 116 are formed on the gate insulating layer 115. Specifically, a resist layer, from which the portions to be provided with the source/drain electrodes 116 have been removed, is formed on the gate insulating layer 115 on the basis of the lithography. Thereafter, the source/drain electrodes 116 are formed by a vacuum evaporation method sequentially. Subsequently, the resist layer is removed. In this manner, the source/drain electrodes 116 are obtained on the basis of a so-called lift-off method.

Step-430

Then, the channel formation region 117 is formed on the gate insulating layer 115 in a manner similar to that described in Example 1.

Step-440

Finally, an insulating material layer (not shown in the drawing) serving as a passivation film is formed all over the surface, and openings are formed in the insulating material layer above the source/drain electrodes 116. A wiring material layer is formed all over the surface including the inside of the openings and, thereafter, the wiring material layer is patterned, so that the photoelectric conversion element 14 is obtained while having a bottom gate/bottom contact type FET (TFT) structure and being provided with the wirings, which are connected to the source/drain electrodes 116, on the insulating material layer.

EXAMPLE 5

In Example 5, specifically, the same configuration and the structure as those of a bottom gate/top contact type FET was adopted as the three-terminal electronic device structure.

Figure 7B:
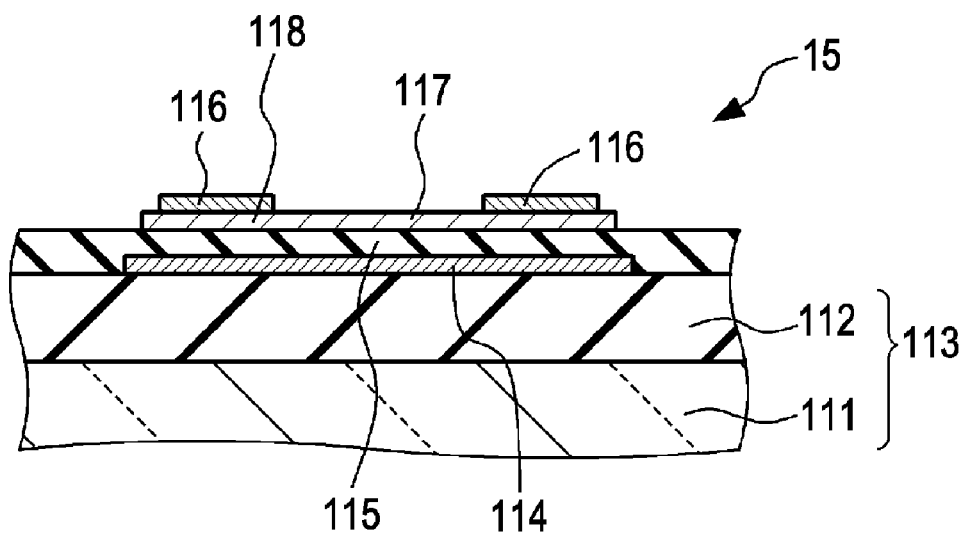

More specifically, as is indicated by a schematic partial sectional view shown in FIG. 7B, a photoelectric conversion element 15 having a bottom gate/top contact type three-terminal electronic device structure in Example 5 includes (a) a control electrode (corresponding to a gate electrode 114) disposed on a support member 113, (b) an insulating layer (corresponding to a gate insulating layer 115) disposed on the control electrode (gate electrode 114) and the support member 113, (c) a photoelectric conversion material layer (corresponding to a channel formation region 117) and a photoelectric conversion material layer extension portion 118 disposed on the insulating layer (gate insulating layer 115), and (d) first/second electrodes (corresponding to source/drain electrodes 116) disposed on the photoelectric conversion material layer extension portion 118.

An outline of a method for manufacturing the photoelectric conversion element 15 in Example 5 will be described below.

Step-500

Initially, as in Step 400 in Example 4, the gate electrode 114 is formed on the support member 113 (insulating film 112). Thereafter, as in Step 410, the gate insulating layer 115 is formed on the gate electrode 114 and the insulating film 112.

Step-510

Subsequently, in a manner similar to that in Step-430, the channel formation region 117 and the channel formation region extension portion 118 are formed on the gate insulating layer 115.

Step-520

Then, the source/drain electrodes 116 are formed on the channel formation region extension portion 118 in such a way as to sandwich the channel formation region 117 as in Step-420 in Example 4. However, when the film formation of the source/drain electrodes 116 is conducted, the source/drain electrodes 116 may be formed without the photolithography process by covering the channel formation region 117 with a hard mask.

Step-530

Finally, a step similar to Step-440 is executed, so that the photoelectric conversion element 15 having a bottom gate/top contact type FET (TFT) structure is obtained.

EXAMPLE 6

In Example 6, specifically, the same configuration and the structure as those of a top gate/bottom contact type FET was adopted as the three-terminal electronic device structure.

Figure 8A:
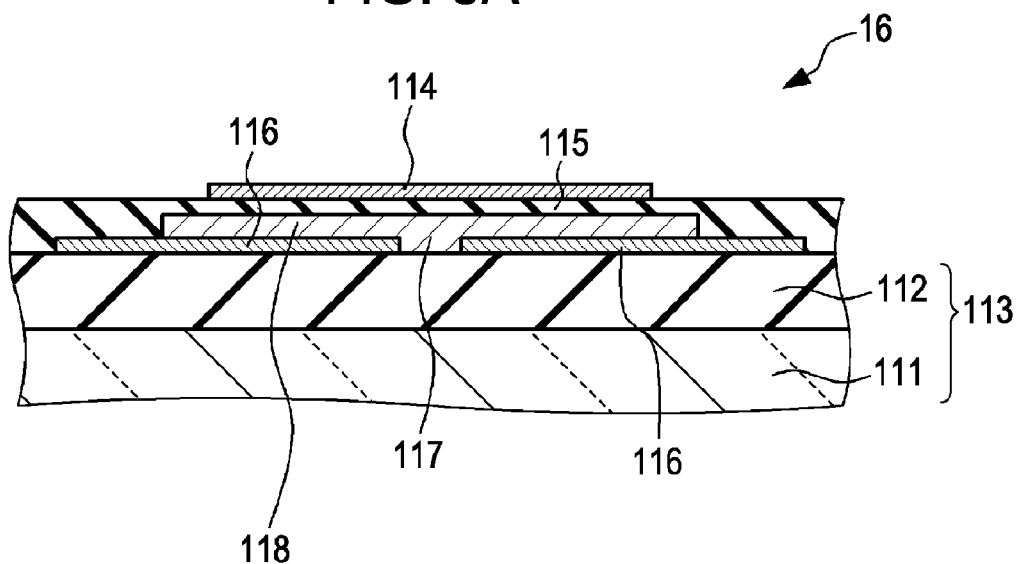
FIGS. 8A and 8B are schematic partial sectional views of photoelectric conversion elements having three-terminal electronic device structures in Example 6 and Example 7, respectively.

More specifically, as is indicated by a schematic partial sectional view shown in FIG. 8A, a photoelectric conversion element 16 having a top gate/bottom contact type three-terminal electronic device structure in Example 6 includes (a) first/second electrodes (corresponding to source/drain electrodes 116) disposed on a support member 113, (b) a photoelectric conversion material layer (corresponding to a channel formation region 117) disposed on the support member 113 between the first/second electrodes (source/drain electrodes 116), (c) an insulating layer (corresponding to a gate insulating layer 115) disposed on the first/second electrodes (source/drain electrodes 116) and the photoelectric conversion material layer (channel formation region 117), and (d) a control electrode (corresponding to a gate electrode 114) disposed on the insulating layer (gate insulating layer 115).

An outline of a method for manufacturing the photoelectric conversion element 16 in Example 6 will be described below.

Step-600

Initially, as in Step 420 in Example 4, the source/drain electrodes 116 are formed on the support member 113.

Step-610

Subsequently, in a manner similar to that in Step-430, the channel formation region 117 is formed on the support member 113 (insulating film 112) between the source/drain electrodes 116. In practice, the channel formation region extension portions 118 are formed on the source/drain electrodes 116.

Step-620

Thereafter, the gate insulating layer 115 is formed on the source/drain electrodes 116 and the channel formation region 117 (in practice, on the channel formation region 117 and the channel formation region extension portion 118). Specifically, the gate insulating layer 115 is obtained by forming a film of PVA all over the surface by a spin coating method.

Step-630

Then, the gate electrode 114 is formed on the gate insulating layer 115. Specifically, a chromium (Cr) layer (not shown in the drawing) serving as an adhesion layer and a gold (Au) layer serving as the gate electrode 114 are formed all over the surface by a vacuum evaporation method sequentially. In the film formation of the gate electrode 114, the gate electrode 114 may be formed without the photolithography process by covering a part of the gate electrode 115 with a hard mask. Finally, a step similar to Step-440 is executed, so that the photoelectric conversion element 16 having a top gate/bottom contact type FET (TFT) structure is obtained.

EXAMPLE 7

In Example 7, specifically, the same configuration and the structure as those of a top gate/top contact type FET was adopted as the three-terminal electronic device structure.

Figure 8B:
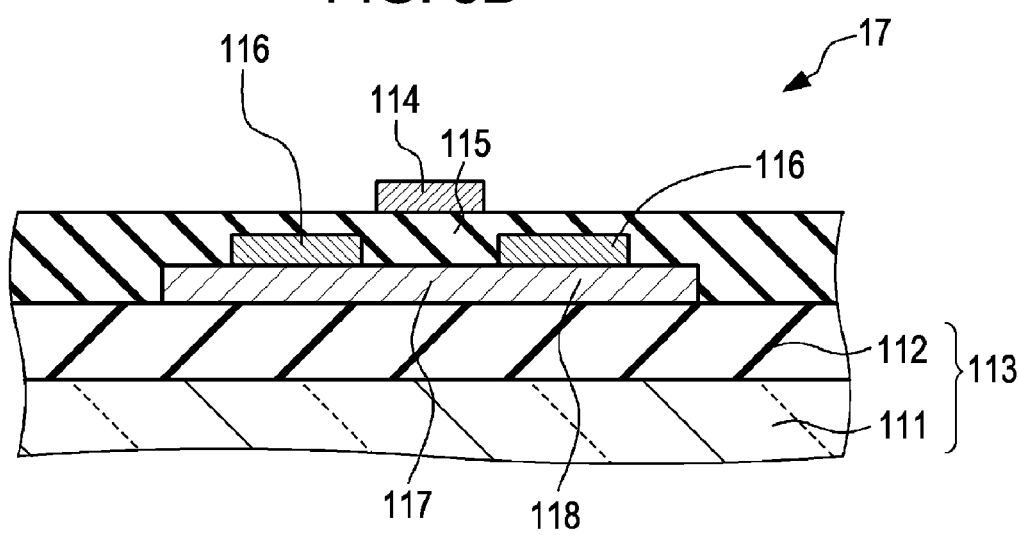

More specifically, as is indicated by a schematic partial sectional view shown in FIG. 8B, a photoelectric conversion element 17 having a top gate/top contact type three-terminal electronic device structure in Example 7 includes (a) a photoelectric conversion material layer (corresponding to a channel formation region 117) and a photoelectric conversion material layer extension portion 118 disposed on a support member 113, (b) first/second electrodes (corresponding to source/drain electrodes 116) disposed on the photoelectric conversion material layer extension portion 118, (c) an insulating layer (corresponding to a gate insulating layer 115) disposed on the first/second electrodes (source/drain electrodes 116) and the photoelectric conversion material layer (channel formation region 117), and (d) a control electrode (corresponding to a gate electrode 114) disposed on the insulating layer (gate insulating layer 115).

An outline of a method for manufacturing the photoelectric conversion element 17 in Example 7 will be described below.

Step-700

Initially, in a manner similar to that in Step-430, the channel formation region 117 and the channel formation region extension portion 118 are formed on the support member 113.

Step-710

Subsequently, the source/drain electrodes 116 are formed on the channel formation region extension portion 118 in such a way as to sandwich the channel formation region 117 as in Step-420 in Example 4. However, when the film formation of the source/drain electrodes 116 is conducted, the source/drain electrodes 116 may be formed without the photolithography process by covering the channel formation region 117 with a hard mask.

Step-720

Thereafter, the gate insulating layer 115 is formed on the source/drain electrodes 116 and the channel formation region 117. Specifically, the gate insulating layer 115 is obtained by forming a film of PVA all over the surface by a spin coating method.

Step-730

Then, as in Step 630 in Example 6, the gate electrode 114 is formed on the gate insulating layer 115. Finally, a step similar to Step-440 is executed, so that the photoelectric conversion element 17 having a top gate/top contact type FET (TFT) structure is obtained.

Up to this point the present invention has been described with reference to preferred examples. However, the present invention is not limited to these examples. The structures, the configurations, the production conditions, the production methods, and the materials used of the photoelectric converters and the photoelectric conversion elements explained in the examples are no more than exemplifications and may be modified appropriately.

The present application contains subject matter related to that disclosed in Japanese Priority Patent Application JP 2008-202296 filed in the Japan Patent Office on Aug. 5, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric converter comprising:
   (a) a photoelectric conversion element, which includes
      (a-1) a first electrode and a second electrode disposed discretely and (a-2) a photoelectric conversion material layer disposed between the first electrode and the second electrode, and in which a current generated in the photoelectric conversion material layer changes with the lapse of an application time, where a constant amount of light is applied to the photoelectric conversion material layer while a voltage is applied between the first electrode and the second electrode; and (b) a current detection circuit to detect the change in the current.

2. The photoelectric converter according to claim 1, wherein the change in the current in the photoelectric conversion material layer with the lapse of the application time corresponds to a change in a transient current passing a capacitor, where it is assumed that the first electrode, the photoelectric conversion material layer, and the second electrode constitute the capacitor.

3. The photoelectric converter according to claim 2, wherein the time constant in a current decreasing period of the change in the current is assumed to be $\tau(P)$, the $\tau(P)$ is represented as a function of the amount of light applied to the photoelectric conversion material layer per unit time and the current detection circuit calculates the $\tau(P)$.

4. The photoelectric converter according to claim 2, wherein the time constant in a current decreasing period of the change in the current is assumed to be $\tau(P)$, the current $I_{dec}$ in the current decreasing period is represented by $$I_{dec}=C_1 \cdot I_0(P) \cdot \exp\{-t/\tau(P)\}+C_2 \quad (1)$$

where t represents an elapsed time from a current decreasing period starting time, at which transition from a current increasing period to the current decreasing period occurs in the change in the current and at which t is assumed to be 0,
$I_0(P)$ represents a current generated in the photoelectric conversion material layer when a constant amount of light is applied to the photoelectric conversion material layer at t=0, and
$C_1$ and $C_2$ represents independently a constant, and the current detection circuit determines $I_{dec}$.

5. The photoelectric converter according to claim 4, wherein the current detection circuit determines the integral of the current by evaluating the integral from 0 to 100 milliseconds, at the maximum, of the formula (1) with respect to t.

6. The photoelectric converter according to claim 1, wherein the photoelectric conversion material layer comprises an organic material.

7. The photoelectric converter according to claim 6, wherein the photoelectric conversion material layer has a carrier mobility of 10 $cm^2$/V·sec or less.

8. A photoelectric conversion element comprising:
(A) a first electrode and a second electrode disposed discretely; and
(B) a photoelectric conversion material layer disposed between the first electrode and the second electrode, wherein a current generated in the photoelectric conversion material layer changes with the lapse of an application time, where a constant amount of light is applied to the photoelectric conversion material layer while a voltage is applied between the first electrode and the second electrode.

9. The photoelectric conversion element according to claim 8, wherein the change in the current in the photoelectric conversion material layer with the lapse of the application time corresponds to a change in a transient current passing a capacitor, where it is assumed that the first electrode, the photoelectric conversion material layer, and the second electrode constitute the capacitor.

10. The photoelectric conversion element according to claim 9,
wherein the time constant in a current decreasing period of the change in the current is assumed to be $\tau(P)$, and
the $\tau(P)$ is represented as a function of the amount of light applied to the photoelectric conversion material layer per unit time.

11. The photoelectric conversion element according to claim 9,
wherein the time constant in a current decreasing period of the change in the current is assumed to be $\tau(P)$,
the current $I_{dec}$ in the current decreasing period is represented by $$I_{dec}=C_1 \cdot I_0(P) \cdot \exp\{-t/\tau(P)\}+C_2 \quad (1)$$

where t represents an elapsed time from a current decreasing period starting time, at which transition from a current increasing period to the current decreasing period occurs in the change in the current and at which t is assumed to be 0,
$I_0(P)$ represents a current generated in the photoelectric conversion material layer, where a constant amount of light is applied to the photoelectric conversion material layer at t=0, and
$C_1$ and $C_2$ represent independently a constant.

12. The photoelectric conversion element according to claim 11, wherein the integral of the current determined by evaluating the integral from 0 to 100 milliseconds, at the maximum, of the formula (1) with respect to t exhibits the dependence on the amount of light.

13. The photoelectric conversion element according to claim 8, wherein the photoelectric conversion material layer comprises an organic material.

14. The photoelectric conversion element according to claim 13, wherein the photoelectric conversion material layer has a carrier mobility of 10 $cm^2$/V·sec or less.

15. The photoelectric conversion element according to claim 8,
wherein the first electrode formed from a transparent electrically conductive material is disposed on a transparent substrate,
the photoelectric conversion material layer is disposed on the first electrode, and
the second electrode is disposed on the photoelectric conversion material layer.

16. The photoelectric conversion element according to claim 8,
wherein the first electrode is disposed on a substrate,
the photoelectric conversion material layer is disposed on the first electrode, and
the second electrode formed from a transparent electrically conductive material is disposed on the photoelectric conversion material layer.

17. The photoelectric conversion element according to claim 8,
wherein the first electrode and the second electrode are disposed on a substrate, and
the photoelectric conversion material layer is disposed over the first electrode and the second electrode on the substrate.

* * * * *